United States Patent [19]

Levinstein et al.

[11] 4,149,905

[45] Apr. 17, 1979

[54] METHOD OF LIMITING STACKING FAULTS IN OXIDIZED SILICON WAFERS

[75] Inventors: Hyman J. Levinstein, Berkeley Heights; Robert B. Marcus; Shyam P. Murarka, both of Murray Hill; Richard S. Wagner, Bernardsville, all of N.J.

[73] Assignee: Bell Telephone Laboratories, Incorporated, Murray Hill, N.J.

[21] Appl. No.: 864,379

[22] Filed: Dec. 27, 1977

[51] Int. Cl.² .................................... H01L 21/322
[52] U.S. Cl. ............................ 148/1.5; 148/187; 357/91
[58] Field of Search .............. 148/1.5, 187; 427/85; 357/91

[56] References Cited

PUBLICATIONS

Kato et al, ". . . Stacking Faults. . . Power Transistors", Solid St. Electr. 19 (1976) 955.
Shiraki et al, "Stacking Faults . . . Elimination . . . by HCl Oxidation," Jap. J. Appl. Phys. 15 (1976) 1.
Sanders et al., "Oxidation . . . Defects . . . in Si", Phil. Mag. 20 (1969) 881.
Shiraki, "Si. . . Annealing . . . Defect Generation", Jap. J. Appl. Phys. 13 (1974) 1514.
Ashburn et al., "Effects of Dislocations in Si . . . ", Solid State Electr. 20 (1977) 731.
Shiraki, ". . . Stacking Faults in Si . . . ", Jap. J. Apl. Phys. 14 (1975) 747.
Hokari et al., ". . . Defect . . . Suppression . . . HCl Oxidation", Jap. J. Appl. Phys.

Primary Examiner—L. Dewayne Rutledge
Assistant Examiner—Upendra Roy
Attorney, Agent, or Firm—Irwin Ostroff

[57] ABSTRACT

Many of the stacking faults which occur after oxidation of silicon wafers are substantially eliminated by the use of an argon-hydrochloric anneal of the wafers just prior to oxidation. This anneal, which is carried out in the same chamber in which oxidation is carried out, removes impurities from the surface of the wafers and thereby limits the sites at which stacking faults form after oxidation.

2 Claims, 1 Drawing Figure

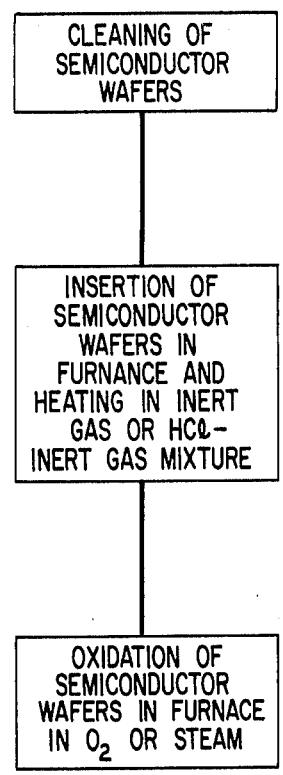

METHOD OF LIMITING STACKING FAULTS IN OXIDIZED SILICON WAFERS

BACKGROUND OF THE INVENTION

This invention relates to silicon wafer fabrication and in particular, to methods for limiting the formation of stacking faults in oxidized silicon wafers.

Typically silicon wafers to be oxidized are first degreased and subjected to a wet chemical cleaning consisting of a scrub and HCl—$H_2O_2$ and $NH_4OH$—$H_2 O_2$ boils in order to remove impurities from the wafers which can result in stacking faults after oxidation. Even with careful cleaning and handling such as is discussed above, many times there is an undesirable density of stacking faults formed after oxidation.

The article entitled "Elimination of Stacking Faults in Silicon Wafers by HCl added Dry $O_2$ Oxidation" at pages 747–751 of the *Japanese Journal of Applied Physics* Vol. 14, No. 6, June 1975, teaches the adding of small amounts of HCl during dry oxidation to decrease stacking faults. The method taught requires temperatures generally in excess of 1200 degrees C and is not useful at lower temperatures. This method also requires relatively a long period of time to be effective and is impractical in many cases because it would result in too much oxide being formed and because many partially fabricated silicon wafers can not be heated to the temperature at which the method is effective. In addition, in this method the surface stacking fault nucleation sites, such as impurities, are not eliminated during oxidation. Furthermore, the method is not applicable to wet or steam oxidations.

It would be desirable to limit surface induced stacking faults in silicon wafer by eliminating the surface nucleation sites (e.g., impurities) with a short duration cleaning process performed prior to oxidation and effectively carried out at temperatures compatible with processing of the wafers.

SUMMARY OF THE INVENTION

The method of the present invention comprises annealing of silicon wafers in an inert or hydrogen chloride-inert ambient in the same chamber where oxidation is subsequently carried out by switching over to an oxidizing ambient. The temperature range typically used is 900 degrees $C \leqq T \leqq$ 1300 degrees C and the time period of the anneal is typically from several minutes to several hours.

In a preferred embodiment a mixture of 99.9% argon (Ar) and 0.1% hydrochloric acid (HCl) is used, and the anneal time is 15 minutes.

The methods of the present invention result in a significant reduction of stacking faults which usually form due to oxidation.

These and other features and advantages of the present invention will be better understood from a consideration of the following detailed description taken in conjunction with the drawings.

BRIEF DESCRIPTION OF THE DRAWING

The FIGURE illustrates the base steps of the present invention.

DETAILED DESCRIPTION

Referring now to the FIGURE there is illustrated the basic steps of the present invention. Semiconductor silicon wafers to be oxidized are first cleaned by degreasing and a wet chemical cleaning. A sequence of typical cleaning steps which has been found useful for cleaning semiconductor silicon wafers in preparation for oxidation thereof is as follows:

(1) Trichlorethylene, 80 degrees C, 15 min
(2) Acetone, 20 degrees C, 2 min
(3) Methanol alcohol, 20 degrees C, 2 min
(4) Deionized-water overflow, 2 min
(5) Solution of 4 parts deionized water, 1 part hydrochloric acid, 1 part hydrogen peroxide, 90 degrees C, 10 min
(6) Deionized-water overflow, 2 min
(7) Scrub slices
(8) Deionized-water rinse, 5 min
(9) Solution of 4 parts deionized water, 1 part ammonium hydroxide, 1 part hydrogen peroxide, 90–95 degrees C, 10 min
(10) Deionized-water overflow, 5 min
(11) Solution of 50 parts deionized water and 1 part hydrofluoric acid, 2½ min
(12) Deionized-water overflow, 5 min
(13) Spin-dry slices.

Immediately after the above-described cleaning is completed the silicon wafers are loaded into a quartz carrier and inserted into an oxidation chamber of a furnace. The chamber is typically maintained in an argon gas ambient at a temperature in the range of 900 degrees $C \leqq T \leqq$ 1300 degrees C. The wafers are annealed in the chamber in argon or another inert gas for a period of time ranging from several minutes to several hours.

In a preferred embodiment of the present invention the annealing time is approximately 15 minutes and a mixture of 99.9 percent argon (Ar) and 0.1 percent hydrochloric acid (HCl) is used during the annealing. The preferred temperature range is 1000–1200 degrees C. This gas mixture is commercially available. HCl in amounts greater than one percent, although successful in eliminating stacking faults, has been found to cause pit formation in the silicon wafers.

Immediately following the annealing step of the present invention, the silicon wafers are kept in the same furnace and dry oxidized in 100 percent oxygen at a temperature in the range of 1000 degrees $C \leqq T \leqq$ 1200 degrees C or steam oxidized at a temperature in the range of 1050 degrees $C \leqq T \leqq$ 1100 degrees C by changing the gas ambient to dry oxygen or to steam, respectively. It is desirable in order to reduce fabrication time to use the oxidizing temperature for the annealing.

Over 140 n and p-type silicon wafers, of [100] and [111] orientation were wet chemically cleaned using the steps described herein above and then oxidized in steam at 1050 degrees C or in oxygen at 1000–1200 degrees C. It was found that stacking-fault density correlates with conductivity type but not with the type of dopant. Table I illustrates the measured density of faults in (cm$^{-2}$) for a large number of silicon wafers which were oxidized without using the annealing step of the present invention. Table II illustrates the measured density of faults in (cm$^{-2}$) for over 160 silicon wafers which were oxidized using the annealing step of the present invention with argon or a mixture of 99.9 percent argon and 0.1 percent hydrochloric gas with an annealing time of 15 minutes.

Table I

| Number of wafers examined | Type of Wafers | | Resistivity (Ω cm) | Density of faults (cm$^{-2}$) |
| --- | --- | --- | --- | --- |
| | Orientation | Type* | | |
| >50 | (100) | p(B) | 8–40 | 50–600 |
| 4 | (100) | p(Ga) | 4–6 | 50–100 |
| >50 | (100) | n(P) | 4–10 | 400–10$^6$ |
| >30 | (100) | n(As) | 4–15 | 400–10$^6$ |
| 4 | (111) | p(B) | 1–10 | ≦100 |
| 4 | (111) | n(P) | 1–10 | ~10$^3$–10$^4$ |

*Dopant given in parentheses.

TABLE II

| Number of wafers examined | Type of Wafers | | Resistivity (Ω cm) | Density of faults (cm$^{-2}$) |
| --- | --- | --- | --- | --- |
| | Orientation | Type* | | |
| >50 | (100) | p(B) | 8–40 | 0 |
| 8 | (100) | p(Ga) | 4–6 | 0 |
| >50 | (100) | n(P) | 4–10 | ≦30 |
| >50 | (100) | n(As) | 4–15 | ≦50 |
| 6 | (111) | p(B) | 1–10 | 0 |
| 6 | (111) | n(P) | 1–10 | ≦100 |

*Dopant given in parentheses.

It has been clearly demonstrated that the annealing of silicon wafers in an inert ambient or in an inert ambient with up to one percent HCl prior to oxidation results in a significant reduction in the density of stacking faults. It is believed that the inert or inert-HCl mixture anneal prior to oxidation removes contamination from the surface of the silicon wafers by driving the contaminants into the bulk or by vaporizing them. These contaminants are believed to be one important cause of the stacking faults.

While the preferred temperature range of the anneal step is 1000–1200 degrees C temperatures, the ranges of 900–1000 degrees C and 1200–1300 degrees C are also believed useful. If a temperature in the range of 900–1000 degrees C is used, the time of the anneal is typically 15 to 60 minutes. The method of the present invention has been successfully used with an argon anneal at a temperature of 900 degrees C and an anneal time of 15 minutes. Temperatures in the range of 1200–1300 degrees C should only be used where there will be no damage to the silicon wafer. The anneal time can be decreased below 15 minutes.

The methods described herein are intended to be illustrative of the general method of the present invention. Various modifications are possible consistant with the spirit of the invention. For example, helium, krypton, neon, xenon or their mixtures can be substituted for the argon.

What is claimed is:

1. A process for fabricating a semiconductor device comprising a semiconductor body comprising the sequence of steps of:

heating the device in a chamber in a gas mixture of an inert gas and hydrochloric acid with the hydrochloric acid being between approximately 0.1 percent and 1.0 percent in an approximate temperature range of between 900 degrees C and 1300 degrees C for a period of time between several minutes and several hours; and thereafter maintaining the semiconductor body in the chamber while changing the ambient gas mixture to an oxidizing gas for long enough to form an oxide on exposed portions of the semiconductor body.

2. The process of claim 1 wherein the inert gas is argon.

* * * * *